US012604547B2

(12) United States Patent
Cao et al.

(10) Patent No.: US 12,604,547 B2
(45) Date of Patent: Apr. 14, 2026

(54) REDUCED FLICKER NOISE TRANSISTOR LAYOUT

(71) Applicant: X-FAB Global Services GmbH, Erfurt (DE)

(72) Inventors: Xuezhou Cao, Plymouth (GB); Shyh Yau Tein, Kota Samarahan (MY); Michaelina Ong, Kuching (MY)

(73) Assignee: X-FAB Global Services GmbH, Erfurt (DE)

( * ) Notice: Subject to any disclaimer, the term of this patent is extended or adjusted under 35 U.S.C. 154(b) by 471 days.

(21) Appl. No.: 17/522,114

(22) Filed: Nov. 9, 2021

(65) Prior Publication Data

US 2022/0149094 A1     May 12, 2022

(30) Foreign Application Priority Data

Nov. 12, 2020    (GB) ...................................... 2017846

(51) Int. Cl.
| | |
|---|---|
| *H10F 39/18* | (2025.01) |
| *H10D 30/01* | (2025.01) |
| *H10F 39/00* | (2025.01) |

(52) U.S. Cl.
CPC ... *H10F 39/80377* (2025.01); *H10D 30/0221* (2025.01); *H10F 39/18* (2025.01)

(58) Field of Classification Search
CPC ......... H01L 27/14616; H01L 27/14643; H01L 29/66659; H01L 21/28123; H01L 29/0692; H01L 29/1041; H01L 29/4238; H01L 29/78; H01L 27/14612; H01L 29/0642; H01L 29/42356; H01L 27/14614
See application file for complete search history.

(56) References Cited

U.S. PATENT DOCUMENTS

| | | | |
|---|---|---|---|
| 2003/0134479 A1 | 7/2003 | Salling et al. | |
| 2005/0245045 A1* | 11/2005 | Shukuri | H10D 84/0151 |
| | | | 257/E21.654 |
| 2007/0018247 A1 | 1/2007 | Brindle et al. | |
| 2008/0242033 A1* | 10/2008 | Levin | H01L 29/7835 |
| | | | 257/E21.345 |
| 2012/0143569 A1* | 6/2012 | Olubuyide | G06F 30/367 |
| | | | 716/112 |
| 2012/0287715 A1* | 11/2012 | Liu | H10B 41/00 |
| | | | 438/257 |

(Continued)

FOREIGN PATENT DOCUMENTS

| | | |
|---|---|---|
| CN | 109786436 | 5/2019 |
| CN | 109801968 | 5/2019 |

OTHER PUBLICATIONS

GB Combined Search and Examination Report for corresponding GB Application No. GB2017846.3, dated Jul. 28, 2021, 9 pages.

(Continued)

*Primary Examiner* — Elias Ullah
(74) *Attorney, Agent, or Firm* — Dority & Manning, P.A.

(57) ABSTRACT

In one aspect, a transistor includes a diffusion region having a drain, a source, and a channel between said drain and source. The transistor further includes an isolation region around said diffusion region for electrically isolating said transistor. In addition, the transistor includes a gate poly overlapping at least a part of said channel, wherein said diffusion region extends laterally beyond said gate poly in a channel width direction.

12 Claims, 8 Drawing Sheets

(56)          References Cited

U.S. PATENT DOCUMENTS

| | | |
|---|---|---|
| 2014/0042506 A1 | 2/2014 | Ramberg et al. |
| 2014/0103440 A1 | 4/2014 | Chatterjee |
| 2014/0226046 A1* | 8/2014 | Lahav .................. H04N 25/532 |
| | | 348/296 |
| 2017/0345929 A1 | 11/2017 | Chatterjee |
| 2019/0067138 A1 | 2/2019 | Lo et al. |
| 2019/0131414 A1 | 5/2019 | Cheng et al. |
| 2019/0165096 A1 | 5/2019 | Kao et al. |
| 2019/0221656 A1 | 7/2019 | Pons et al. |
| 2023/0378090 A1 | 11/2023 | Cheng et al. |

OTHER PUBLICATIONS

Office Action (with English translation) received in corresponding Application No. DE 102021129595.5, dated Dec. 9, 2023, 20 pages.

Peng et al., "Influence of the Total Ionizing Dose Irradiation on 130 nm Floating-body PDSOI NMOSFETs", Nuclear Science, vol. 62, No. 1, Feb. 2015, pp. 314-322.

German Office Action (w/ English translation) for corresponding Application No. 102021129595.5, dated Jan. 15, 2024, 16 pages.

Hsieh et al., "Focal-Plane-Arrays and CMOS Readout Techniques of Infrared Imaging Systems", IEEE Transaction on Circuits and Systems for Video Technology, vol. 7, No. 4, Aug. 1997, pp. 594-605.

Tietze et al., "Halbleiter-Schaltungstechnik", Berlin, Heidelberg: Springer-Verlag Berlin Heidelberg, 9th edition, 1989, VII-XIII, pp. 93-94.

Chinese Office Action (w/ Machine translation) for corresponding Application No. 2021113443277, dated Mar. 23, 2024, 13 pages.

Chinese Office Action (w/ English Machine Translation) for corresponding Application No. 202111344327.7, dated Sep. 12, 2024, 10 pages.

Notice of Hearing (w/ English translation) in corresponding DE Application No. 102021129595.5, dated Jul. 29, 2025, in 16 pgs.

Minutes of the Hearing (w/ English translation) in corresponding DE Application No. 102021129595.5, dated Jun. 25, 2025, in 22 pgs.

Smith J.C.: ESD protection in thin film silicon on insulator technologies. In: Microelectronics reliability, vol. 38, 1998, No. 11, pp. 1669-1680. ISSN 0026-2714.

* cited by examiner

A-A'

B-B'

REDUCED FLICKER NOISE TRANSISTOR LAYOUT

CROSS-REFERENCE TO RELATED APPLICATIONS

The present application is based upon and claims the right of priority to UK Patent Application No. 2017846.3, filed Nov. 12, 2020, the disclosure of which is hereby incorporated by reference herein in its entirety for all purposes.

FIELD

The invention relates to transistors, and in particular to transistor layouts for reducing flicker noise.

BACKGROUND

Transistors are used everywhere in modern society and there is an ongoing need for improving their performance.

FIGS. 1 to 3 show an n-channel MOSFET (nmos) transistor 2 formed in a substrate 3 and having a diffusion region 4 (also referred to as "active region" in the art and referring to the region not covered by isolation material such as shallow trench isolation, STI, or LOCal Oxidation of Silicon, LOCOS) including a drain 6, a source 8, and a channel 10 there between. The channel 10, indicated as a region between dotted lines in FIG. 1, is the region of a p-doped well 11 in which current flows between the source 8 and drain 6. A gate polysilicon (poly) 12 is located over the channel 10 for switching the transistor on or off by applying a bias voltage to the gate poly 12, thereby opening the channel 10 and allowing current to flow through the channel 10 from the drain 6 to the source 8. The gate poly 12 is separated from the underlying substrate 3 by gate oxide 13. The drain 6 and source 8 comprise n-doped regions in the p-doped well 11. The transistor 2 is isolated by shallow trench isolation 14 (STI) surrounding the diffusion region 4. The drain 6, source 8, and gate poly 12 have respective metal contacts 16, 18, and 20 for forming electrical connections. The N+ symbol indicates that a large N+ implant covers the whole area of the transistor 2, but is blocked by the STI 14 and the gate poly 12, so that only drain and source regions (bounded by the STI 14 and the gate poly 12) become n-doped. The gate poly 12 also becomes n-doped, which is important to set a correct work function for the gate.

SUMMARY

Aspects of the invention provide a transistor, a source follower circuit and a complementary metal oxide semiconductor (CMOS) image sensor as set out in the appended claims.

Specific embodiments of the invention will now be described with reference to the accompanying drawings.

DETAILED DESCRIPTION

Low noise complementary metal oxide semiconductor (CMOS) transistors are required for many analogue applications. For example, a source follower in a CMOS image sensor (CIS) may require low flicker noise performance at a current of a few μA to a few 10 μA. Hence, embodiments described herein can provide transistors that can reduce the flicker noise in such source follower circuits.

Figure 4:
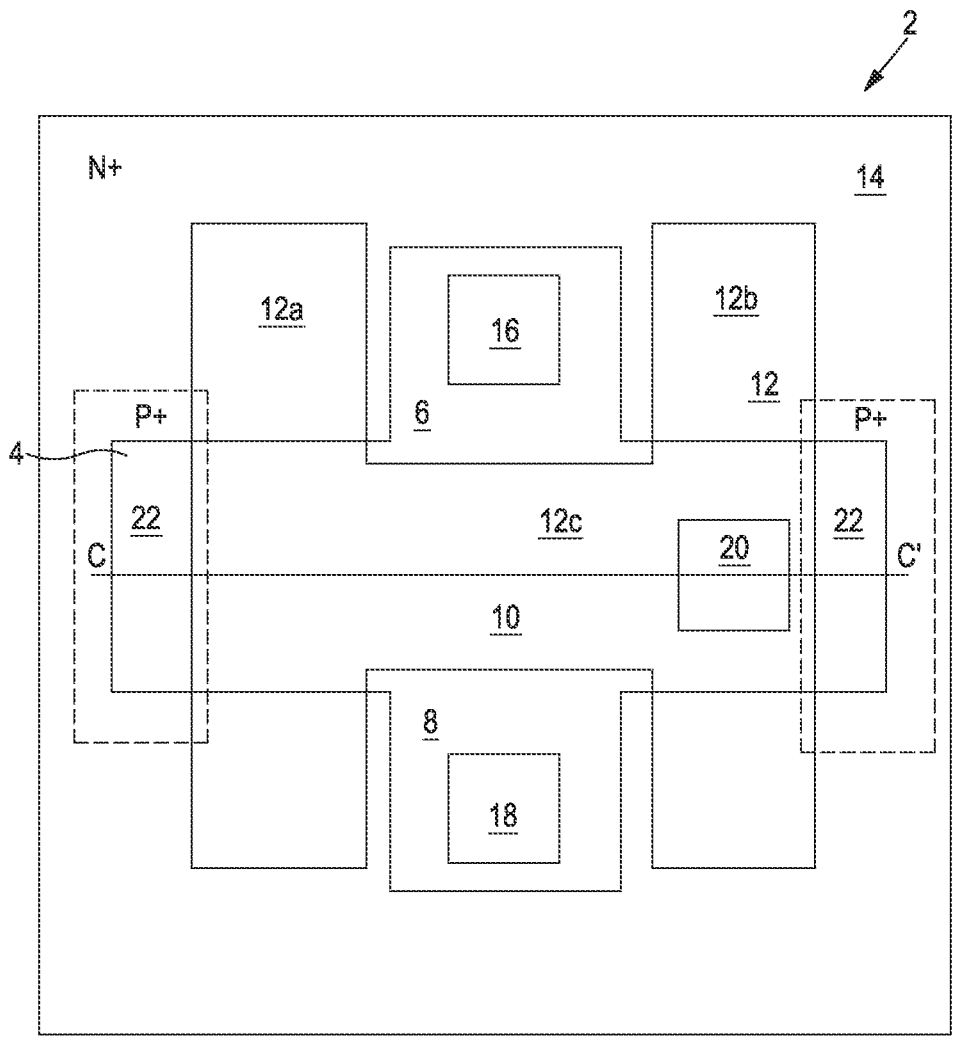
FIG. 4 shows a schematic top view of an n-channel MOSFET according to an embodiment.
Figure 5:
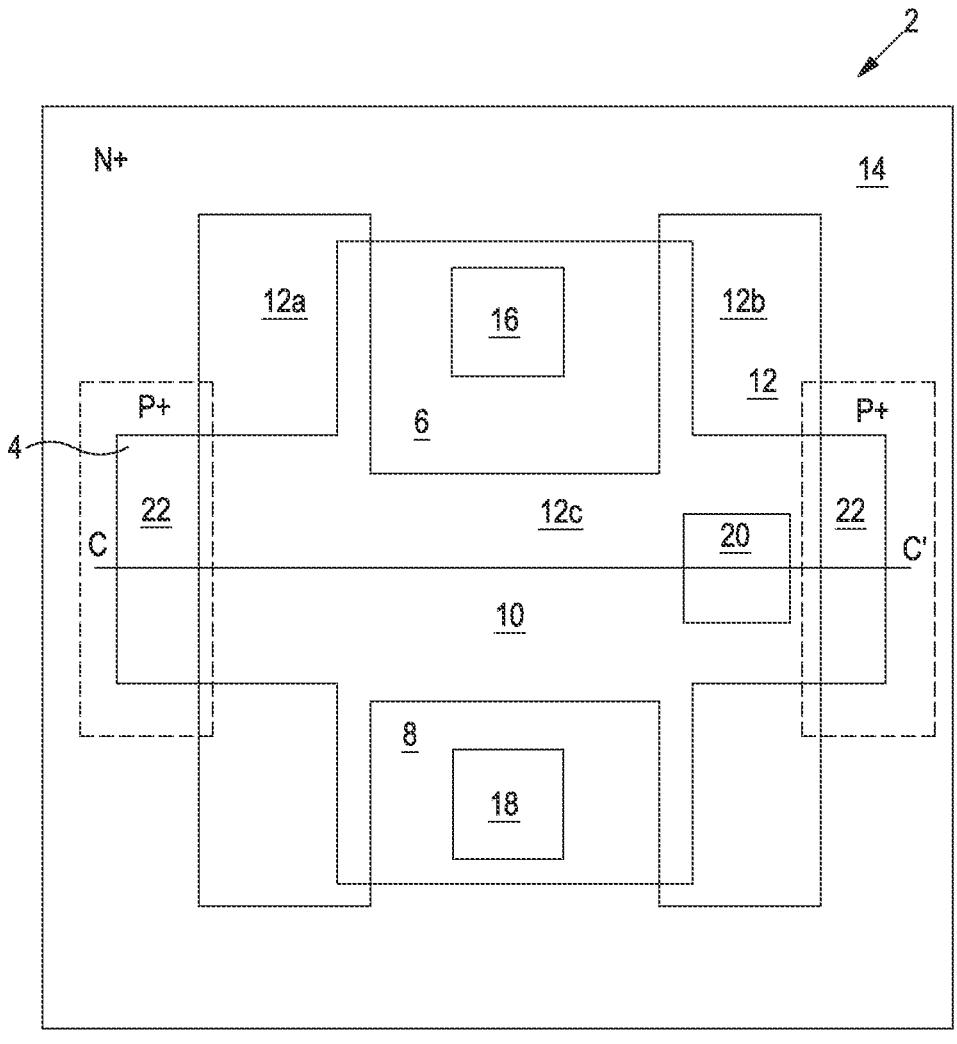
FIG. 5 shows a schematic top view of an n-channel MOSFET according to another embodiment.
Figure 6:
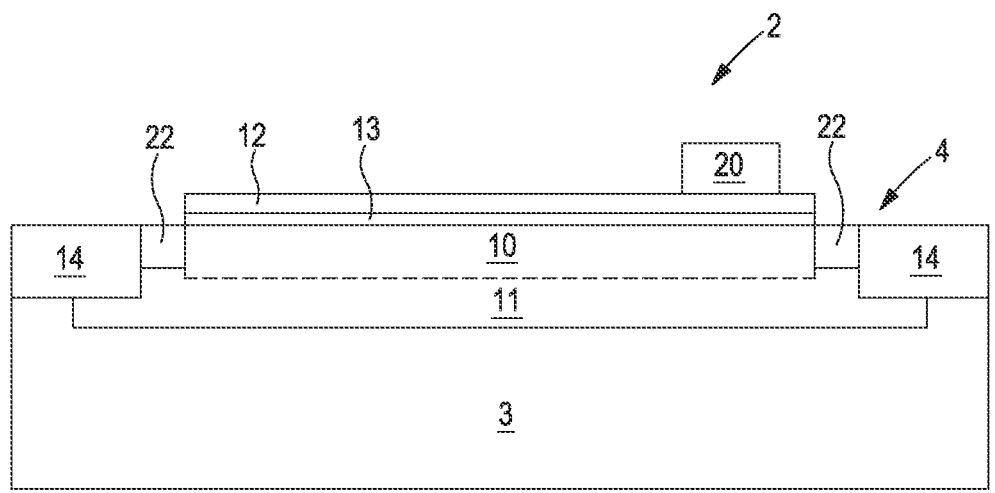
FIG. 6 shows a schematic cross sectional view of the n-channel MOSFET according to the embodiment of FIG. 4 or FIG. 5.

FIGS. 4, 5 and 6 show an n-channel MOSFET transistor 2 according to different embodiments. Similar or equivalent features in different figures have been given the same reference numerals to aid understanding and are not intended to limit the illustrated embodiments.

Figure 2:
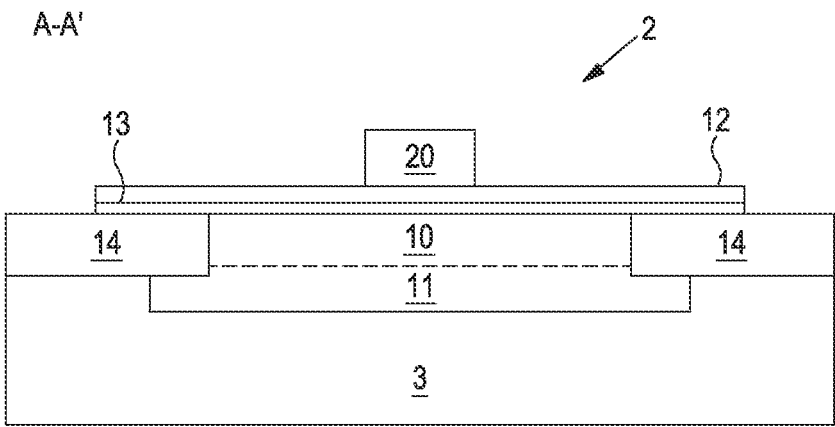
FIG. 2 shows a schematic cross sectional view of the n-channel MOSFET.
Figure 3:
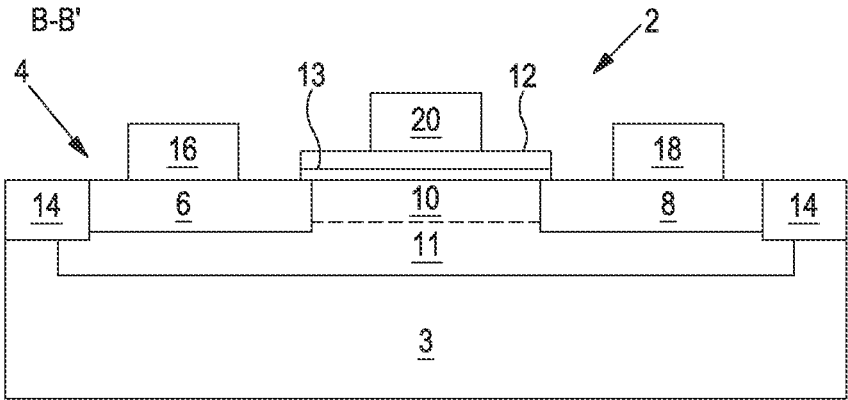
FIG. 3 shows a schematic diagram of another cross section of the n-channel MOSFET.

FIG. 4 shows a schematic top view of the transistor 2 having a diffusion region 4 including a drain 6, a source 8, and a channel 10 there between. The diffusion region 4 is defined as the doped surface layer of the substrate 3, created using the so called diffusion mask (DIFF mask) in the fabrication process. Unlike the transistor illustrated in FIGS. 1 to 3, the diffusion region 4 extends laterally in the width direction (i.e. perpendicular to the direction of current flow, between source 8 and drain 6, in the channel 10 when the transistor 2 is in use) on both sides of the channel 10. Hence, the channel 10 is edged along its length by a P+ doped region and not by the surrounding STI 14 like a conventional CMOS design. Dashed regions indicate the location of the P+ implant. These regions are typically shielded from the main N+ implantation by the N+ mask. A gate poly 12 and gate oxide 13 are located over the channel 10 for switching the transistor on or off by applying a bias voltage to the gate poly 12, thereby opening the channel 10 and allowing current to flow through the channel 10 from the drain 6 to the source 8. The channel 10 runs through the diffusion region 4 and extends all the way out to the edges of the gate poly 12 (hence, whereas the channel 10 is indicated by dotted lines in FIG. 1, this is not possible in FIG. 4 since the dotted lines that would indicate the channel 10 would be obscured by the lines of the gate poly 12 over the diffusion region 4). The gate poly 12 has an H-shape, with two side parts 12a and 12b bridged by a crossbar 12c over the channel 10. Along the width of the channel 10, the gate poly 12 terminates over a P+ region 22 in the diffusion region 4, rather than over the STI 14. This can reduce the 1/f noise of the transistor, especially for low currents (typically <10 µA). Metal contacts 16, 18 and 20 connect to the drain 6, source 8, and gate poly 12 respectively.

FIG. 5 shows a schematic top view of the transistor 2 according to an embodiment similar to that of FIG. 4. The difference between the embodiments of FIGS. 4 and 5 is the position of the diffusion region 4 in relation to the gate poly 12. As seen in FIG. 5, the gate poly 12 overlaps the diffusion region 4 at the drain 6 and source 8. This may further reduce the flicker noise.

FIG. 6 shows a schematic cross sectional side view along the line C-C' of the transistor 2 of the embodiment of FIG. 4 or FIG. 5 for example. The channel 10 in the p-doped well 11 under the gate 12 is edged on both sides by heavily doped P+ regions 22 in the diffusion region 4, instead of being in direct contact with STI 14. Heavy doping (also referred to as high doping) may refer to a doping concentration on the order of 1 dopant per 10,000 (ten thousand) atoms or greater.

Table 1 shows how the output referral noise (spectral ID) of a MOSFET having a H-shaped gate according to an embodiment, such as the n-channel MOSFET illustrated in FIGS. 4 and 5, compares to the noise of a conventional transistor.

TABLE 1

| Noise comparison | |
| --- | --- |
| Bias condition at 100 Hz | Relative noise of embodiment |
| Id = 0.01 µA | 1.9 decade lower |
| Id = 0.1 µA | 1.4 decade lower |
| Id = 1 µA | 0.9 decade lower |
| Id = 10 µA | 1.0 decade lower |
| Id = 100 µA | 0.3 decade lower |

Figure 1:
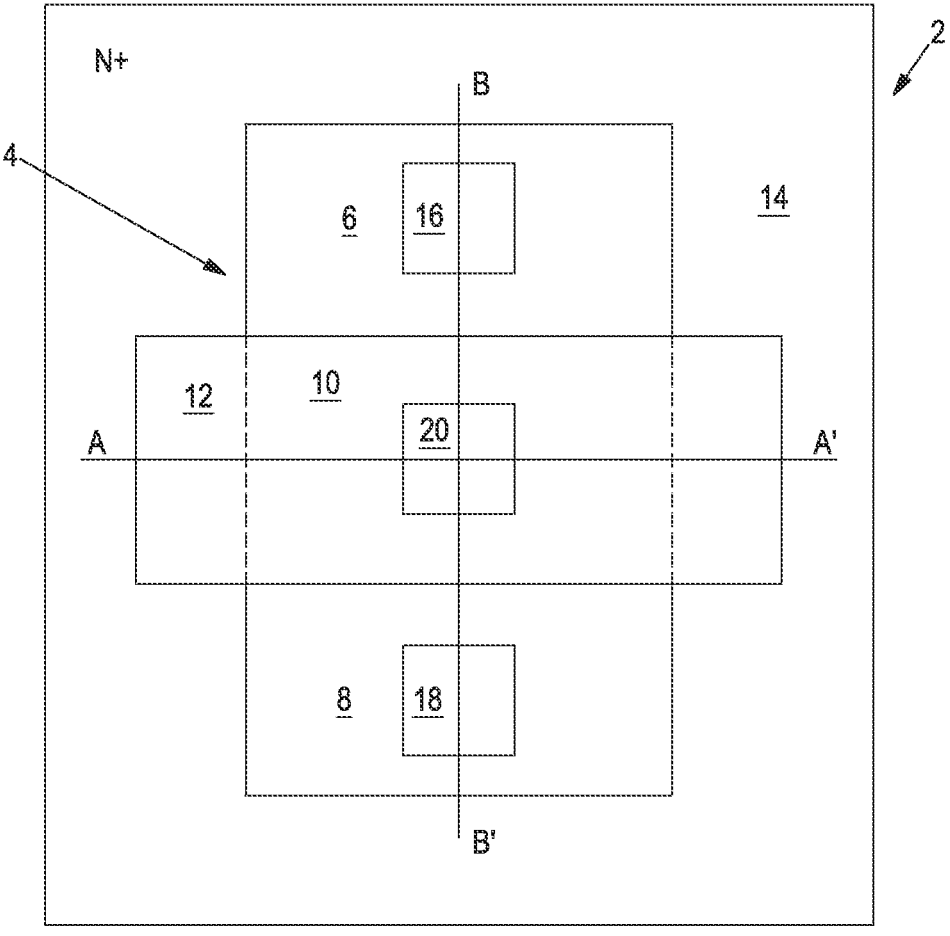
FIG. 1 shows a schematic top view of a conventional n-channel MOSFET.
Figure 7:
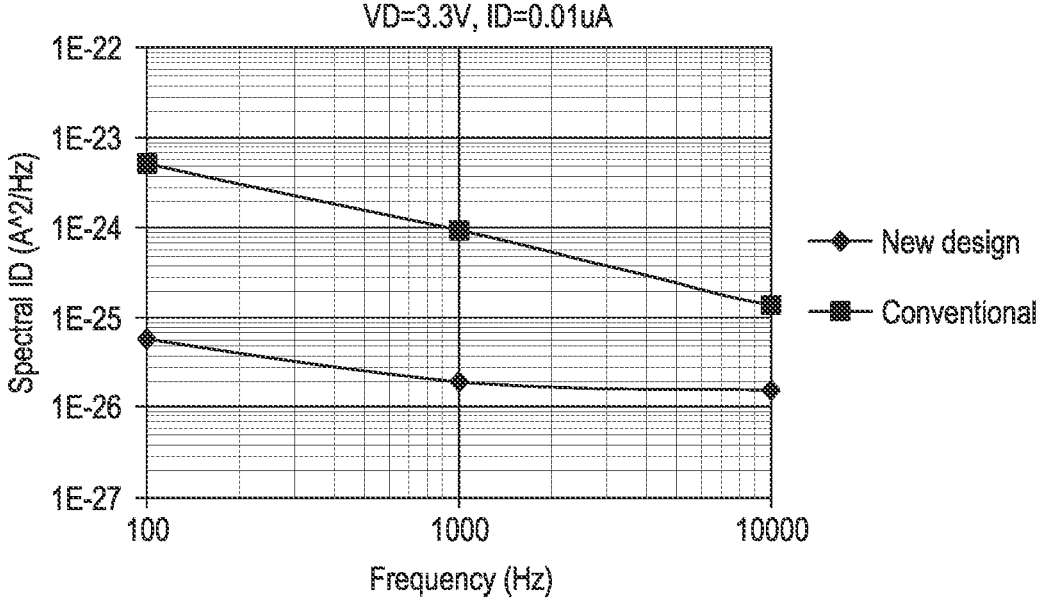
FIG. 7 shows a graph plotting the spectral ID (noise) of a transistor according to an embodiment and a conventional transistor against frequency at 0.01 μA drain current.
Figure 8:
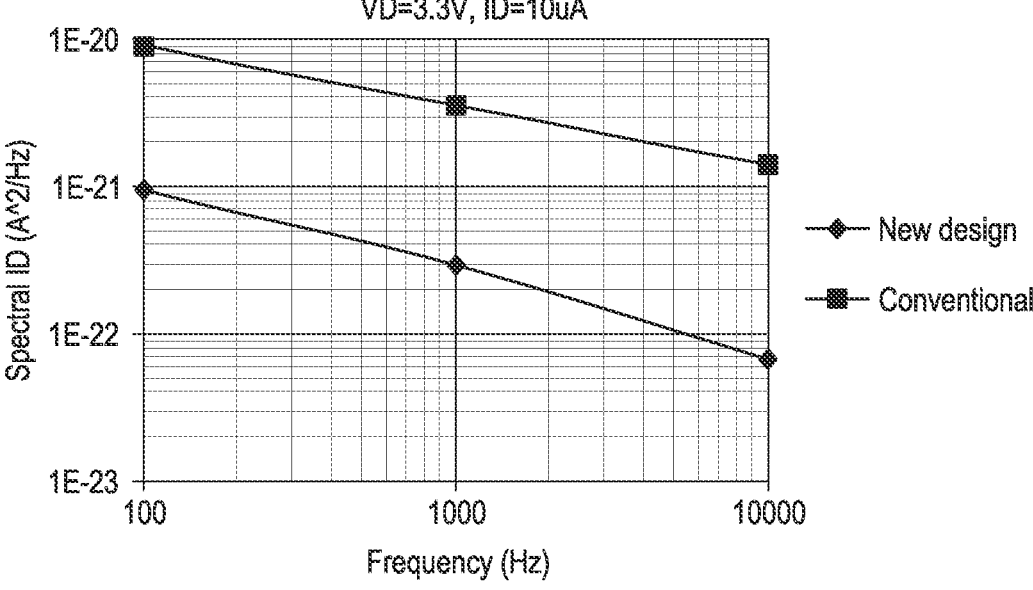
FIG. 8 shows a similar graph plotting the spectral ID (noise) of a transistor according to the embodiment and the conventional transistor against frequency at 10 μA drain current.

FIGS. 7 and 8 show graphs plotting the spectral ID against frequency for two 3.3 V n-channel MOSFETs at 0.01 µA and 10 µA respectively, wherein both transistors have the same size but one transistor has a H-shaped gate according to an embodiment (e.g. as shown in FIG. 4), whereas the other transistor has a conventional layout as shown in FIG. 1. As can be seen from the graphs, the transistor according to the embodiment has consistently lower noise across the whole frequency spectrum from 100 Hz to 10 kHz.

Figure 9:
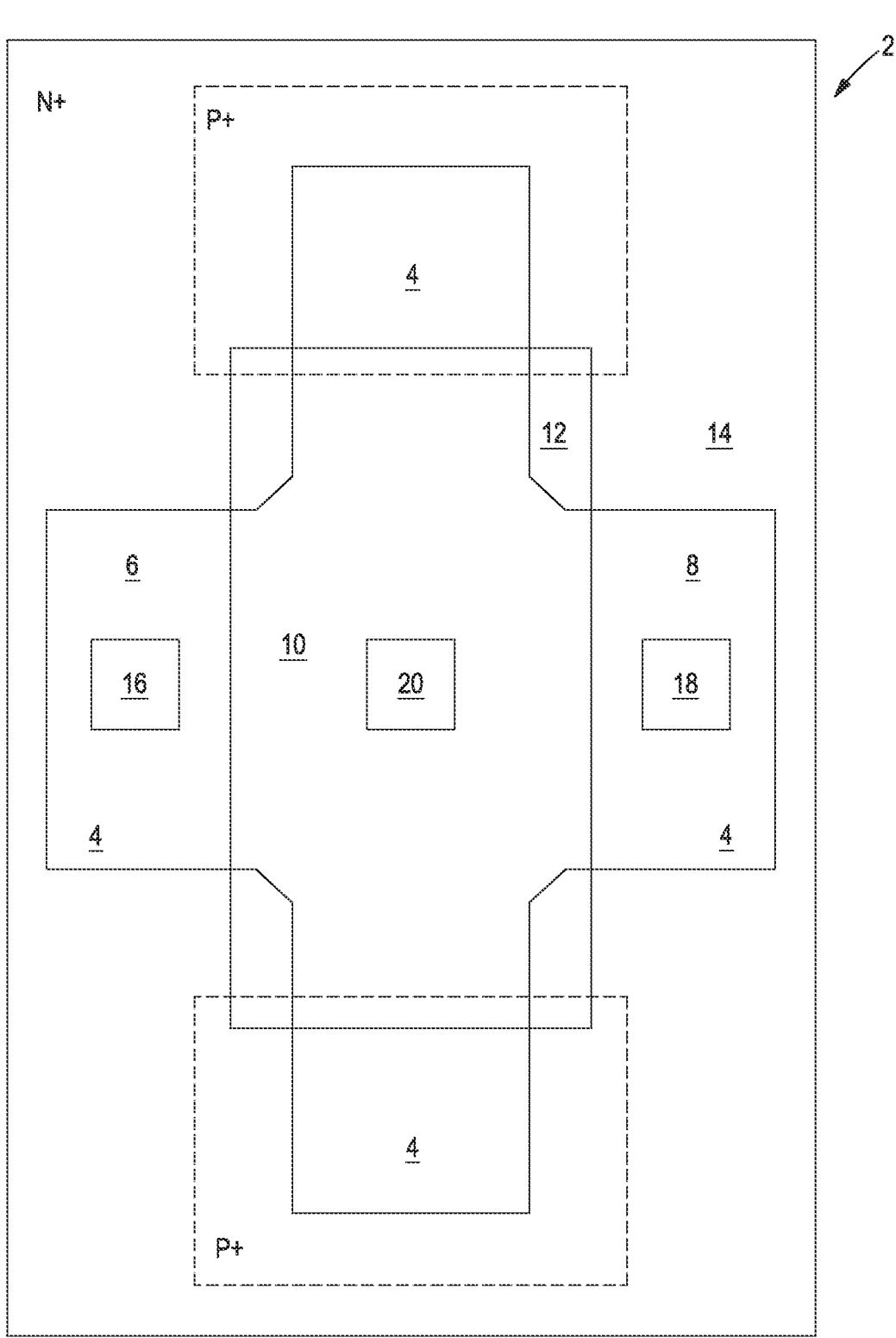
FIG. 9 shows a schematic top view of another n-channel MOSFET according to an embodiment.

FIG. 9 shows a schematic diagram of another layout of an n-channel MOSFET transistor 2 according to an embodiment, which can reduce the flicker noise. The transistor 2 comprises a diffusion region 4 with drain 6 and source 8, having respective contacts 16 and 18. A gate poly 12 is located over the diffusion region 4 and having contacts 20. STI 14 surrounds the diffusion region to isolate the transistor 2. The diffusion region 4 is extends horizontally so that the gate poly 12 terminates over the P+ region 22 in the diffusion region 4 instead of over the STI 14.

Table 2 shows how the noise (spectral ID) of an n channel MOSFET according to an embodiment, such as the n-channel MOSFET illustrated in FIG. 9, compares to the noise of a conventional n channel transistor.

TABLE 2

| Noise comparison, n channel MOSFET | |
| --- | --- |
| Bias condition at 100 Hz | Relative noise of embodiment |
| Id = 0.01 µA | 1.6 decade lower |
| Id = 0.1 µA | 0.7 decade lower |
| Id = 1 µA | 1.0 decade lower |

TABLE 2-continued

| Noise comparison, n channel MOSFET | |
| --- | --- |
| Bias condition at 100 Hz | Relative noise of embodiment |
| Id = 10 µA | 0.4 decade lower |
| Id = 100 µA | 0.4 decade lower |

Figure 10:
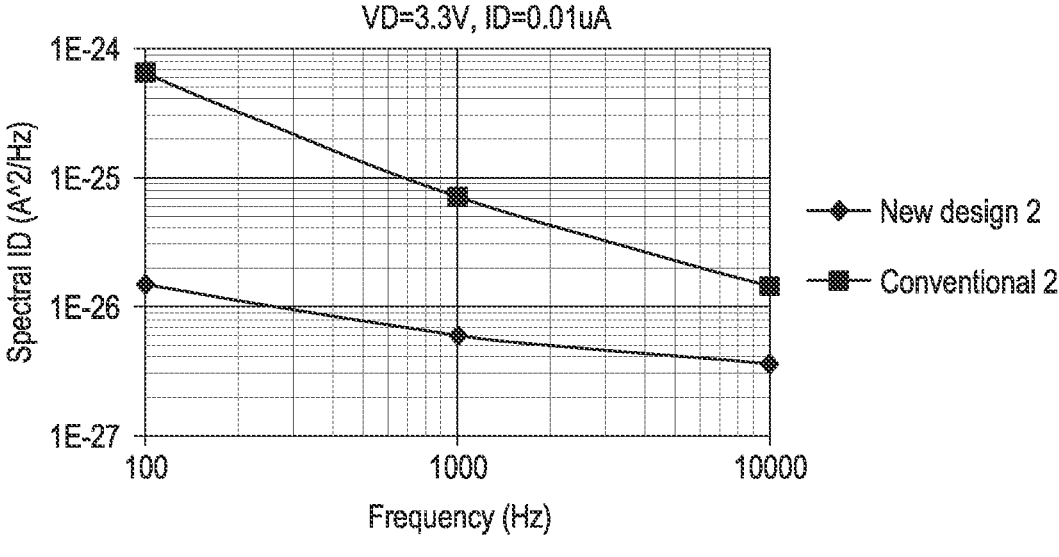
FIG. 10 shows a graph plotting the spectral ID (noise) of a transistor according to another embodiment and a conventional transistor against frequency at 0.01 μA drain current.
Figure 11:
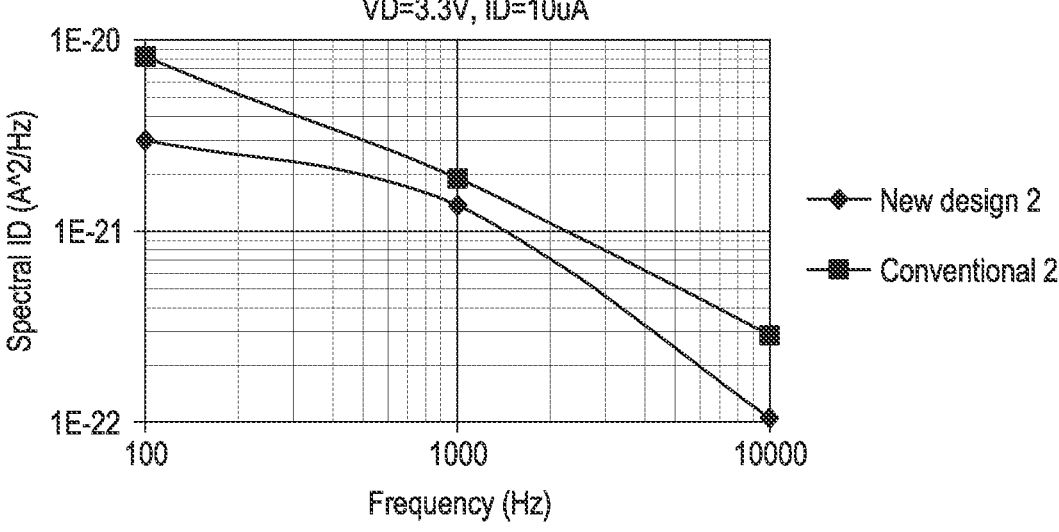
FIG. 11 shows a similar graph plotting the spectral ID (noise) of a transistor according to the embodiment and a conventional transistor against frequency at 10 μA drain current.

FIGS. 10 and 11 show graphs plotting the spectral ID against frequency for two 3.3 V n-channel MOSFETs at 0.01 µA and 10 µA respectively, wherein both transistors have the same size but one transistor is a transistor according to an embodiment as shown in FIG. 9, whereas the other transistor has a conventional layout as shown in FIG. 1. As can be seen from the graphs, the transistor according to the embodiment has consistently lower noise across the whole frequency spectrum from 100 Hz to 10 kHz.

In general, embodiments described herein provide a transistor comprising a diffusion region comprising a drain, a source, and a channel between said drain and source, an isolation region around said diffusion region for electrically isolating said transistor (e.g. STI or LOCOS). The transistor further comprises a gate overlapping at least a part of said channel, wherein said diffusion region extends in a width direction, i.e. substantially perpendicular to a direction of current flow through said channel when the transistor is in use (i.e. when the transistor is switched on so that current flows through the channel), beyond said gate. By having the gate terminate over the diffusion region (e.g. over a P+ doped region of the diffusion region), instead of over the isolation region, the noise may be significantly improved in particular when drawing a small current. For example, the transistor may be particularly suitable for use as a source follower in a CMOS image sensor, which typically has a drain current of <10 µA.

The drain and source may comprise respective n-doped regions and said channel may run between said n-doped regions in a p-doped well (e.g. an n-channel MOSFET), wherein first and second opposing sides of said channel are edged by heavily doped P+ regions, such that said heavily doped P+ regions separate said channel from said isolation region. By separating the channel from the isolation region with the heavily doped regions the noise can be further reduced. The gate may terminate before said heavily doped P+ regions (i.e. the gate does not extend in the width direction over said heavily doped P+ regions).

Alternatively, said drain and source comprise respective p-doped regions and the channel may run between said p-doped regions in an n-doped well (e.g. a p-channel MOS-FET), wherein first and second opposing sides of said channel are edged by heavily doped N+ regions, such that said heavily doped N+ regions separate said channel from said isolation region.

The gate may be H-shaped (see e.g. FIG. 4) or may be square shaped (see e.g. FIG. 9) with a cross-shaped diffusion (active) region, to further reduce noise and provide some radiation protection by shielding the interface between the isolation region and the diffusion region. The gate typically comprises a polysilicon layer.

The transistor may be a transistor configured to operate at 1.8 V, 3.3 V or 5 V, etc. The transistor may be particularly advantageous in reducing noise for low voltage transistors. Similarly, the transistor may be a transistor configured to draw a small current (e.g. <10 µA), for which the noise reduction may be greater.

Other embodiments provide a source follower circuit comprising a transistor according to the embodiments described herein, and a CMOS image sensor (CIS) comprising a plurality of such transistors.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A transistor comprising:
   a diffusion region comprising a drain, a source, and a channel between said drain and source;
   an isolation region around said diffusion region for electrically isolating said transistor; and
   a gate poly overlapping at least a part of said channel, wherein said diffusion region extends in a channel width direction, being substantially perpendicular to a direction from said source to said drain, beyond said gate poly,
   wherein the diffusion region comprises heavily doped P+ or N+ regions, and wherein first and second opposing sides of said channel are edged by said heavily doped P+ or N+ regions.

2. The transistor according to claim 1, wherein said drain and source comprise respective n-doped regions and said channel runs between said n-doped regions in a p-doped well, and wherein first and second opposing sides of said channel are edged by said heavily doped P+ regions, such that said heavily doped P+ regions separate said channel from said isolation region.

3. The transistor according to claim 2, wherein said gate poly does not extend over said heavily doped P+ regions.

4. The transistor according to claim 1, wherein said drain and source comprise respective p-doped regions and said channel runs between said p-doped regions in an n-doped well, and wherein first and second opposing sides of said channel are edged by said heavily doped N+ regions, such that said heavily doped N+ regions separate said channel from said isolation region.

5. The transistor according to claim 1, wherein said gate poly is H-shaped.

6. The transistor according to claim 1, wherein said gate poly comprises a polysilicon layer.

7. The transistor according to claim 1, wherein said transistor is configured to operate at one of 1.2 V, 1.5 V, 1.8 V, 3.3 V and 5 V.

8. The transistor according to claim 1, wherein said transistor is configured to draw a current of <10 μA.

9. A source follower circuit comprising a transistor according to claim 1.

10. A CMOS image sensor (CIS) comprising a plurality of transistors according to claim 1.

11. The transistor according to claim 1, wherein said diffusion region has a cross shape, and said source and drain are located in respective opposing arms of said cross shape.

12. The transistor according to claim 1, wherein the diffusion region is laterally bounded by the isolation region.

* * * * *